(12) United States Patent
Kim et al.

(10) Patent No.: US 9,336,944 B2
(45) Date of Patent: May 10, 2016

(54) MULTILAYER CERAMIC ELECTRONIC COMPONENT AND BOARD FOR MOUNTING THE SAME

(71) Applicant: SAMSUNG ELECTRO-MECHANICS CO., LTD., Suwon, Gyunggi-do (KR)

(72) Inventors: Wi Heon Kim, Gyunggi-do (KR); Dae Bok Oh, Gyunggi-do (KR); Jea Hoon Lee, Gyunggi-do (KR); Sang Huk Kim, Gyunggi-do (KR); Jae Yeol Choi, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/956,641

(22) Filed: Aug. 1, 2013

(65) Prior Publication Data

US 2014/0318845 A1    Oct. 30, 2014

(30) Foreign Application Priority Data

Apr. 30, 2013    (KR) .................. 10-2013-0048125

(51) Int. Cl.
*H01G 4/228*    (2006.01)
*H01G 4/01*    (2006.01)
(Continued)

(52) U.S. Cl.
CPC . *H01G 4/01* (2013.01); *H01G 2/06* (2013.01); *H01G 4/005* (2013.01); *H01G 4/06* (2013.01);
(Continued)

(58) Field of Classification Search
CPC ............. H01G 4/01; H01G 4/30; H01G 4/06; H01G 4/012; H01G 4/12; H01G 4/005; H01G 2/06; H05K 1/181
See application file for complete search history.

(56) References Cited

U.S. PATENT DOCUMENTS

2005/0088803 A1    4/2005  Umeda et al.
2008/0049377 A1*   2/2008  Sutardja .................... 361/306.3
(Continued)

FOREIGN PATENT DOCUMENTS

JP           5-74644 A    3/1993
JP          06-215978 A   8/1994
(Continued)

OTHER PUBLICATIONS

Korean Office Action issued in Korean Application No. 10-2013-0048125 dated Jun. 19, 2014, w/English translation.
(Continued)

*Primary Examiner* — Steven T Sawyer
(74) *Attorney, Agent, or Firm* — McDermott Will & Emery LLP

(57) ABSTRACT

There are provided a multilayer ceramic electronic component and a board for mounting the same. The multilayer ceramic electronic component includes a hexahedral ceramic body including dielectric layers and satisfying T/W>1.0 when a width thereof is defined as W and a thickness thereof is defined as T; an active layer in which capacitance is formed, by including a plurality of first and second internal electrodes alternately exposed through both end surfaces of the ceramic body, having the dielectric layer interposed therebetween, an upper cover layer formed above the active layer; a lower cover layer formed below the active layer and having a greater thickness than the upper cover layer; and first and second external electrodes covering the end surfaces of the ceramic body, wherein when a thickness of the lower cover layer is defined as Tb, 0.03≤Tb/T≤0.25 is satisfied.

10 Claims, 6 Drawing Sheets

(51) Int. Cl.
   *H01G 4/06*       (2006.01)
   *H01G 4/30*       (2006.01)
   *H05K 1/18*       (2006.01)
   *H01G 2/06*       (2006.01)
   *H01G 4/005*      (2006.01)
   *H01G 4/12*       (2006.01)
   *H05K 3/34*       (2006.01)

(52) U.S. Cl.
   CPC . *H01G 4/12* (2013.01); *H01G 4/30* (2013.01); *H05K 1/181* (2013.01); *H05K 3/3442* (2013.01); *H05K 2201/10015* (2013.01); *H05K 2201/10454* (2013.01)

(56) References Cited

U.S. PATENT DOCUMENTS

| | | | |
|---|---|---|---|
| 2009/0147440 A1* | 6/2009 | Cygan et al. | 361/306.3 |
| 2011/0090619 A1* | 4/2011 | Symes et al. | 361/321.4 |
| 2012/0152604 A1 | 6/2012 | Ahn et al. | |
| 2012/0300361 A1* | 11/2012 | Togashi | 361/301.4 |
| 2013/0056252 A1* | 3/2013 | Fujii et al. | 174/260 |

FOREIGN PATENT DOCUMENTS

| | | |
|---|---|---|
| JP | 08-130160 A | 5/1996 |
| JP | 09-260184 A | 10/1997 |
| JP | 2004-193352 A | 7/2004 |
| JP | 2005-129802 A | 5/2005 |
| JP | 2007-142342 A | 6/2007 |
| JP | 2012-216864 A | 11/2012 |

OTHER PUBLICATIONS

Korean Office Action issued in Korean Application No. 10-2013-0048125 dated Feb. 23, 2015, with English translation.

Japanese Office Action issued in Japanese Application No. 2013-149310 dated Feb. 27, 2015, with English Translation.

* cited by examiner

MULTILAYER CERAMIC ELECTRONIC COMPONENT AND BOARD FOR MOUNTING THE SAME

CROSS-REFERENCE TO RELATED APPLICATIONS

This application claims the priority of Korean Patent Application No. 10-2013-0048125 filed on Apr. 30, 2013, in the Korean Intellectual Property Office, the disclosure of which is incorporated herein by reference.

BACKGROUND OF THE INVENTION

1. Field of the Invention

The present invention relates to a multilayer ceramic capacitor and a board for mounting the same.

2. Description of the Related Art

In accordance with the recent trend for miniaturization of electronic products, the demand for a multilayer ceramic electronic component having small size and large capacitance has increased.

Therefore, efforts to stack thin dielectric layers and internal electrodes in greater amounts have been attempted using various methods, and recently, a multilayer ceramic electronic component in which a thickness of the dielectric layer is reduced and the number of stacked dielectric layers is increased has been manufactured.

Accordingly, the multilayer ceramic electronic component is able to be miniaturized, due to the dielectric layers and the internal electrodes being thinned, allowing the number of stacked layers to be increased for the implementation of a high level of capacitance.

Meanwhile, a multilayer ceramic capacitor among multilayer ceramic electronic components may have a structure in which a plurality of dielectric layers are included and internal electrodes having opposite polarities are alternately stacked while having the dielectric layer interposed therebetween.

Since the dielectric layers have piezoelectric and electrostrictive properties, when direct current (DC) voltage or alternating current (AC) voltage is applied to the multilayer ceramic capacitor, a piezoelectric phenomenon may occur between the internal electrodes to thereby generate vibrations.

Such vibrations may be transferred to a printed circuit board on which the multilayer ceramic capacitor is mounted through a solder, such that the entire printed circuit board may become an acoustic reflection surface to transmit the sound of vibrations as noise.

Vibration noise may have a frequency corresponding to an audio frequency within a range of 20 to 20000 Hz, potentially causing listener discomfort. The vibration noise causing listener discomfort, as described above, is known as acoustic noise.

As described above, the multilayer ceramic electronic component is able to be miniaturized and the number of stacked layers is increased to allow the multilayer ceramic electronic component to have a thickness greater than a width, so that high capacitance may be implemented therein. However, when the multilayer ceramic electronic component is mounted on the board, the acoustic noise may be increased.

Therefore, research into a technology of reducing the acoustic noise when the multilayer ceramic electronic component is mounted on the board while achieving high capacitance is still required.

RELATED ART DOCUMENT (Patent Document 1) Japanese Patent Laid-Open Publication No. JP 2005-129802

SUMMARY OF THE INVENTION

An aspect of the present invention provides a multilayer ceramic capacitor and a board for mounting the same.

According to an aspect of the present invention, there is provided a multilayer ceramic electronic component including: a hexahedral ceramic body including dielectric layers and satisfying T/W>1.0 when a width thereof is defined as W and a thickness thereof is defined as T; an active layer in which capacitance is formed, by including a plurality of first and second internal electrodes alternately exposed through both end surfaces of the ceramic body, having the dielectric layer interposed therebetween, an upper cover layer formed above the active layer; a lower cover layer formed below the active layer and having a greater thickness than the upper cover layer; and first and second external electrodes covering the end surfaces of the ceramic body, wherein when a thickness of the lower cover layer is defined as Tb, $0.03 \leq Tb/T \leq 0.25$ is satisfied.

The dielectric layers may have an average thickness of 0.1 μm to 0.6 μm.

The first and second internal electrodes may have a thickness of 0.6 μm or less.

The dielectric layers may be stacked in an amount of 500 or more layers.

The first and second internal electrodes may be stacked in a thickness direction of the ceramic body.

The first and second internal electrodes may be stacked in a width direction of the ceramic body.

According to another aspect of the present invention, there is provided a board for mounting a multilayer ceramic electronic component, the board including: a printed circuit board having first and second electrode pads disposed thereon; and a multilayer ceramic electronic component mounted on the printed circuit board, wherein the multilayer ceramic electronic component includes: a hexahedral ceramic body including dielectric layers and satisfying T/W>1.0 when a width thereof is defined as W and a thickness thereof is defined as T; an active layer in which capacitance is formed, by including a plurality of first and second internal electrodes alternately exposed through both end surfaces of the ceramic body, having the dielectric layer interposed therebetween, an upper cover layer formed above the active layer; a lower cover layer formed below the active layer and having a greater thickness than the upper cover layer; and first and second external electrodes covering the end surfaces of the ceramic body, wherein when a thickness of the lower cover layer is defined as Tb, $0.03 \leq Tb/T \leq 0.25$ is satisfied.

The dielectric layers may have an average thickness of 0.1 μm to 0.6 μm.

The first and second internal electrodes may have a thickness of 0.6 μm or less.

The dielectric layers may be stacked in an amount of 500 or more layers.

The first and second internal electrodes may be stacked in a thickness direction of the ceramic body.

The first and second internal electrodes may be stacked in a width direction of the ceramic body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
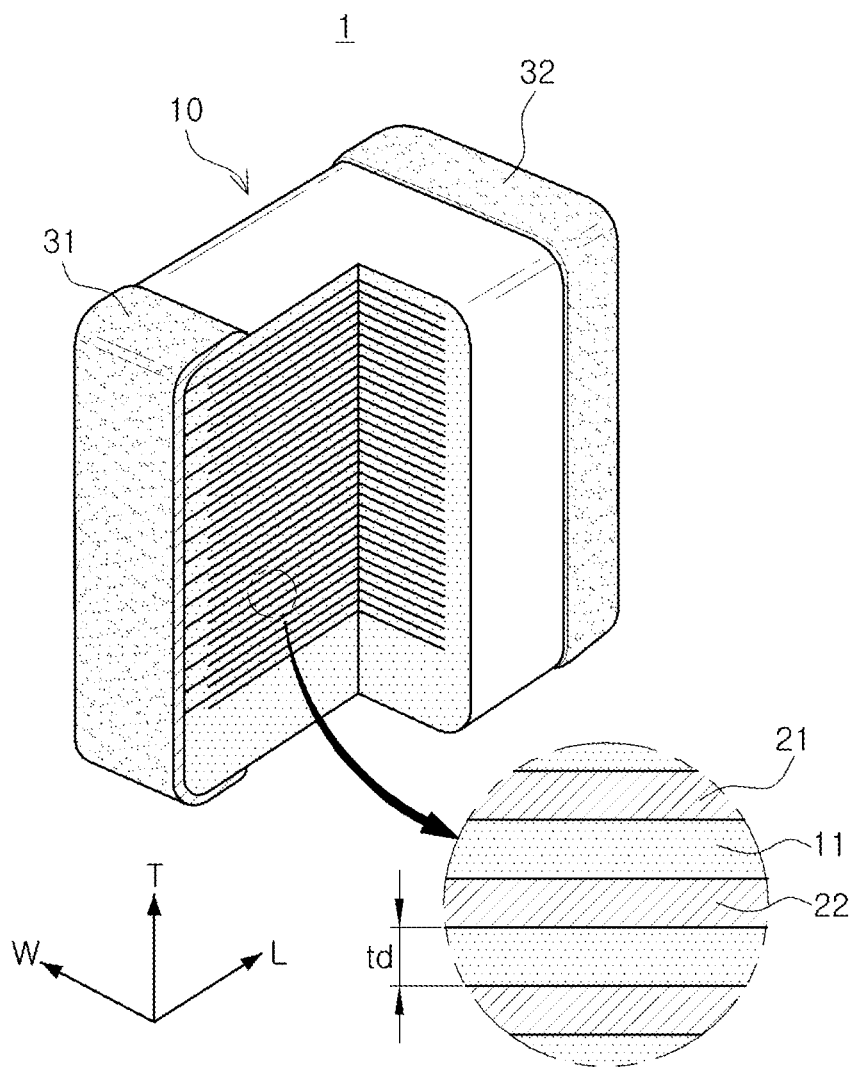
FIG. 1 is a partially cut-away perspective view schematically showing a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Multilayer Ceramic Capacitor

Hereinafter, embodiments of the present invention will now be described in detail with reference to the accompanying drawings.

FIG. 1 is a partially cut-away perspective view schematically showing a multilayer ceramic capacitor according to an embodiment of the present invention.

Figure 2:
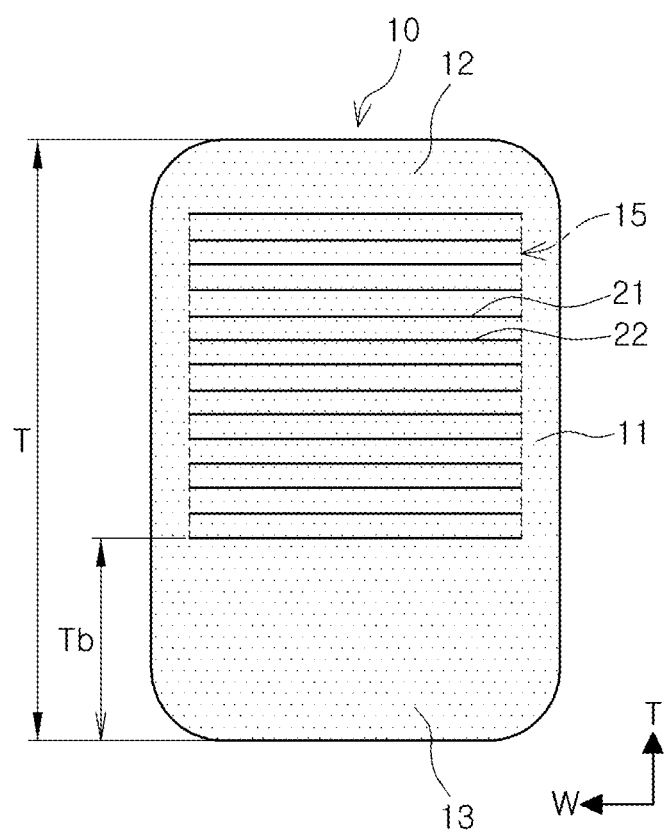
FIG. 2 is a cross-sectional view of the multilayer ceramic capacitor of FIG. 1 taken in a width direction.

FIG. 2 is a cross-sectional view of the multilayer ceramic capacitor of FIG. 1 taken in a width direction.

Referring to FIGS. 1 and 2, a multilayer ceramic electronic component according to an embodiment of the invention may include: a hexahedral ceramic body 10 including a dielectric layer 11 and satisfying T/W>1.0 when a width thereof is defined as W, and a thickness thereof is defined as T; and an active layer 15 in which capacitance is formed, by including a plurality of first and second internal electrodes 21 and 22 formed to be alternately exposed through both end surfaces of the ceramic body 10, having the dielectric layer 11 interposed therebetween, an upper cover layer 12 formed above the active layer 15; a lower cover layer 13 formed below the active layer 15 and being thicker than the upper cover layer 12; and first and second external electrodes 31 and 32 formed to cover the end surfaces of the ceramic body 10.

Hereinafter, a multilayer ceramic electronic component, in particular, a multilayer ceramic capacitor, according to an embodiment of the invention will be described; however, the invention is not limited thereto.

A shape of the ceramic body 10 is not particularly limited, and for example, the ceramic body 10 may have a hexahedral shape.

Meanwhile, in the multilayer ceramic capacitor according to the embodiment of the invention, a 'length direction' refers to an 'L' direction, a 'width direction' refers to a 'W' direction, and a 'thickness direction' refers to a 'T' direction. Here, the 'thickness direction' is the same as a direction in which dielectric layers are stacked, that is, a 'stacking direction of first and second internal electrodes.'

The multilayer ceramic capacitor 1 according to the embodiment of the invention may include a hexahedral ceramic body 10 including the dielectric layers 11 and satisfying T/W>1.0 when a width thereof is defined as W, and a thickness thereof is defined as T; and first and second internal electrodes 21 and 22 stacked in the ceramic body 10 so as to face each other, having the dielectric layer 11 interposed therebetween.

A material for forming the first and second internal electrodes 21 and 22 is not particularly limited. For example, the first and second internal electrodes 21 and 22 may be formed of a conductive paste made of at least one of noble metal materials such as palladium (Pd) and a palladium-silver (Pd—Ag) alloy, and the like, nickel (Ni) and copper (Cu).

The dielectric layer 11 may include a ceramic powder having high permittivity, for example, a barium titanate-based ($BaTiO_3$) powder or a strontium titanate-based ($SrTiO_3$) powder, but the invention is not limited thereto.

Meanwhile, the first and second internal electrodes 21 and 22, a pair of electrodes having opposite polarities, may be formed by printing a conductive paste containing a conductive metal on the dielectric layers 11 to have a predetermined thickness.

An average thickness of the first and second internal electrodes 21 and 22 after sintering is not particularly limited as long as the internal electrodes may form capacitance. For example, the average thickness of the first and second internal electrodes may be 0.6 μm or less.

The average thickness of the internal electrodes 21 and 22 may be measured on an image obtained by scanning a cross-section of the ceramic body 10 in a width direction using a scanning electron microscope (SEM), as shown in FIG. 2.

For example, as shown in FIG. 2, the average thickness of the internal electrode may be calculated by measuring thicknesses at thirty equidistant points in the width direction of any one of the internal electrodes extracted from the image obtained by scanning the cross-section of the ceramic body 10 in the width and thickness (W-T) direction cut in a central portion of the ceramic body 10 in the length direction, using the SEM.

The thicknesses at thirty equidistant points may be measured in a capacitance forming part, a region in which the first and second internal electrodes 21 and 22 are overlapped with each other.

In addition, in the case in which the average thickness measurement is performed with respect to 10 or more internal electrodes, the average thickness of the internal electrodes may be significantly generalized.

Further, the first and second internal electrodes 21 and 22 may be alternately exposed through both end surfaces of the ceramic body, and may be electrically insulated from each other by the dielectric layer 11 disposed therebetween.

That is, the first and second internal electrodes 21 and 22 may be electrically connected to the first and second external electrodes 31 and 32, respectively, through portions of the first and second internal electrodes 21 and 22 alternately exposed through the end surfaces of the ceramic body 10.

Therefore, in the case in which voltage is applied to the first and second external electrodes 31 and 32, electric charges are stored between the first and second internal electrodes 21 and 22 facing each other. Here, capacitance of the multilayer ceramic capacitor 1 is proportional to an area of an overlap region of the first and second internal electrodes 21 and 22.

In order to form capacitance, the first and second external electrodes 31 and 32 may be formed on both end surfaces of the ceramic body 10, and may be electrically connected to the first and second internal electrodes 21 and 22, respectively.

The first and second external electrodes 31 and 32 may be formed of the same conductive material as that of the internal electrodes, but the material for the first and second external electrodes 31 and 32 is not limited thereto. For example, the first and second external electrodes 31 and 32 may be formed of copper (Cu), silver (Ag), nickel (Ni), or the like.

The first and second external electrodes 31 and 32 may be formed by adding a glass frit to a metal powder to prepare a conductive paste, applying the prepared conductive paste to outer surfaces of the ceramic body 10, followed by sintering thereof.

The ceramic body 10 may be formed by stacking the plurality of dielectric layers 11 and performing a sintering process. A shape and dimensions of the ceramic body and the number of stacked dielectric layers included therein are not limited to those shown in the present embodiment.

In addition, the plurality of dielectric layer 11 forming the ceramic body 10 are in a sintered state such that boundaries between adjacent dielectric layers may not be discernable without using the SEM.

The ceramic body 10 may include the active layer 15, a capacitance forming part contributing to capacitance formation, and upper and lower cover layers 12 and 13 formed above and below the active layer 15 as upper and lower margin parts, respectively.

The active layer 15 may be formed by repeatedly stacking the plurality of first and second internal electrodes 21 and 22, having each of the dielectric layers 11 interposed therebetween.

According to the embodiment of the invention, an average thickness td of the dielectric layer 11 may be arbitrarily changed according to a capacity design of the multilayer ceramic capacitor 1, but the average thickness of the dielectric layer after sintering may be 0.1 to 0.6 μm.

The average thickness td of the dielectric layer 11 may be measured on the image obtained by scanning the cross-section of the ceramic body 10 in the width direction using the SEM, as shown in FIG. 2.

For example, as shown in FIG. 2, the average thickness of the dielectric layer may be calculated by measuring thicknesses at thirty equidistant points in the width direction of any one of the dielectric layers extracted from the image obtained by scanning the cross-section of the ceramic body 110 in the width and thickness (W-T) direction, cut in the central portion of the ceramic body 110 in the length direction, using the SEM.

The thicknesses at thirty equidistant points may be measured in a capacitance forming part, in which the first and second internal electrodes 21 and 22 are overlapped with each other.

In addition, in the case in which the average thickness measurement is is performed with respect to 10 or more dielectric layers, the average thickness of the dielectric layers may be significantly generalized.

In the case in which the average thickness of the dielectric layer 11 is less than 0.1 μm, a distance between the internal electrodes may be short to thereby cause a short-circuit defect, and in the case in which the average thickness of the dielectric layer 11 is greater than 0.6 μm, high capacitance may not be implemented.

The upper and lower cover layers 12 and 13 may have the same material and configuration as those of the dielectric layers 11, except that the upper and lower cover layers do not have internal electrodes.

The upper and lower cover layers 12 and 13 may be formed by stacking one or two or more dielectric layers on uppermost and lowermost surfaces of the active layer 15 in a vertical direction, respectively, and may serve to prevent the first and second internal electrodes 21 and 22 from being damaged by physical or chemical stress.

In addition, the lower cover layer 13 may be thicker than the upper cover layer 12 by increasing the number of stacked dielectric layers as compared to the upper cover layer 12.

Since the lower cover layer 13 is thicker than the upper cover layer 12 as described above, acoustic noise may be reduced when the multilayer ceramic capacitor according to the embodiment of the invention is mounted on a board.

The number of stacked dielectric layers 11 is not particularly limited, and may be, for example, 500 or more.

By allowing the number of stacked dielectric layers 11 to be 500 or more, a high capacitance multilayer ceramic capacitor, in which the thickness T of the ceramic body is greater than the width W thereof, may be realized.

Meanwhile, $T/W>1.0$ may be satisfied when the width and the thickness of the ceramic body 10 are defined as W and T, respectively.

The multilayer ceramic capacitor 1 according to the embodiment of the invention is formed to have an increased number of stacked layers therein for the realization of high capacitance, and the thickness T of the ceramic body 10 may be greater than the width W thereof.

General multilayer ceramic capacitors, on the other hand, have been manufactured such that a width thereof is almost the same as a thickness thereof.

However, a size of the multilayer ceramic capacitor according to the embodiment of the invention may be decreased, and sufficient space may be secured when being mounted on a board, and therefore, the number of stacked layers may be increased in order to realize a high capacitance multilayer ceramic capacitor.

Since the stacking direction of the dielectric layers in the ceramic body is a thickness direction, as the number of stacked layers is increased, a relationship of thickness T and width W of the ceramic body may satisfy $T/W>1.0$.

According to the embodiment of the invention, the multilayer ceramic capacitor is manufactured to satisfy $T/W>1.0$, so that large capacitance may be implemented therein.

Meanwhile, by manufacturing the multilayer ceramic capacitor to satisfy $T/W>1.0$, acoustic noise may be increased when the multilayer ceramic capacitor is mounted on a board.

However, according to the embodiment of the invention, when a thickness of the ceramic body 10 is defined as T and a thickness of the lower cover layer 13 is defined as Tb, $0.03 \leq Tb/T \leq 0.25$ is satisfied, such that the acoustic noise may be reduced when the multilayer ceramic capacitor 1 is mounted on the board.

Hereinafter, a relationship between dimensions of elements included in the multilayer ceramic capacitor according to the embodiment of the invention and acoustic noise will be described.

The overall thickness T of the ceramic body 10 refers to a distance from an upper surface to a lower surface of the ceramic body 10, and an overall thickness of the active layer 15 refers to a distance from an upper surface of the first internal electrode 21 located in the uppermost portion of the active layer 15 to a lower surface of the second internal electrode 22 located in the lowermost portion of the active layer 15.

In addition, the thickness Tb of the lower cover layer 13 refers to a distance from the lower surface of the second internal electrode 22 located in the lowermost portion of the active layer 15 to the lower surface of the ceramic body 10 in a thickness direction, and the thickness of the upper cover layer 12 refers to a distance from the upper surface of the first internal electrode 21 located in the uppermost portion of the active layer 15 to the upper surface of the ceramic body 10 in the thickness direction.

In the case in which voltages having opposite polarities are applied to the first and second external electrodes 31 and 32 formed on both end portions of the multilayer chip capacitor 1, the ceramic body 10 may expand and contract in the thickness direction due to an inverse piezoelectric effect occurring in the dielectric layer 11, and both end portions of the first and second external electrodes 31 and 32 may contract and expand, contrary to the expansion and contraction of the ceramic body 10 in the thickness direction, due to the Poisson effect.

Here, portions of the first and second external electrodes 31 and 32 corresponding to a central portion of the active layer 15 may be maximally expanded and contracted, thereby causing acoustic noise.

That is, in the present embodiment of the invention, in order to reduce acoustic noise, a point of inflection (PI) formed on both end surfaces of the ceramic body 10 may be positioned at a height equal to or below that of the center of the ceramic body in the thickness direction, due to a difference between a deformation rate occurring in the central portion of the active layer 15 and a deformation rate occurring in the lower cover layer 13 when the voltages are applied thereto.

That is, the thickness of the lower cover layer 13 is greater than that of the upper cover layer 12, and a ratio of the thickness Tb of the lower cover layer 13 to the thickness T of the ceramic body 10 satisfies $0.03 \leq Tb/T \leq 0.25$, whereby the acoustic noise may be reduced.

As a result, the multilayer ceramic capacitor may achieve high capacitance and excellent reliability.

In the case in which the ratio Tb/T of the thickness Tb of the lower cover layer 13 to the thickness T of the ceramic body 10 is less than 0.03, the acoustic noise may be increased.

Meanwhile, in the case in which the ratio Tb/T of the thickness Tb of the lower cover layer 13 to the thickness T of the ceramic body 10 is greater than 0.25, capacitance may be reduced, and thus, the multilayer ceramic capacitor may fail to have high capacitance.

Figure 3:
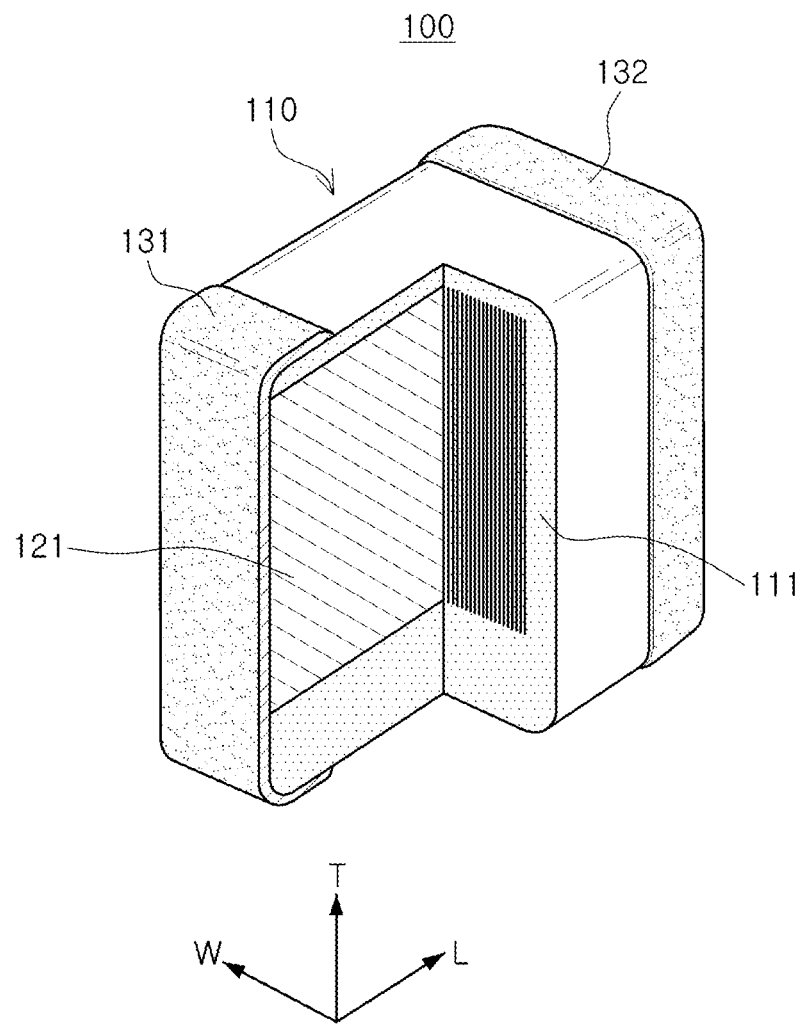
FIG. 3 is a partially cut-away perspective view schematically showing a multilayer ceramic capacitor according to another embodiment of the present invention.

FIG. 3 is a partially cut-away perspective view schematically showing a multilayer ceramic capacitor according to another embodiment of the present invention.

Figure 4:
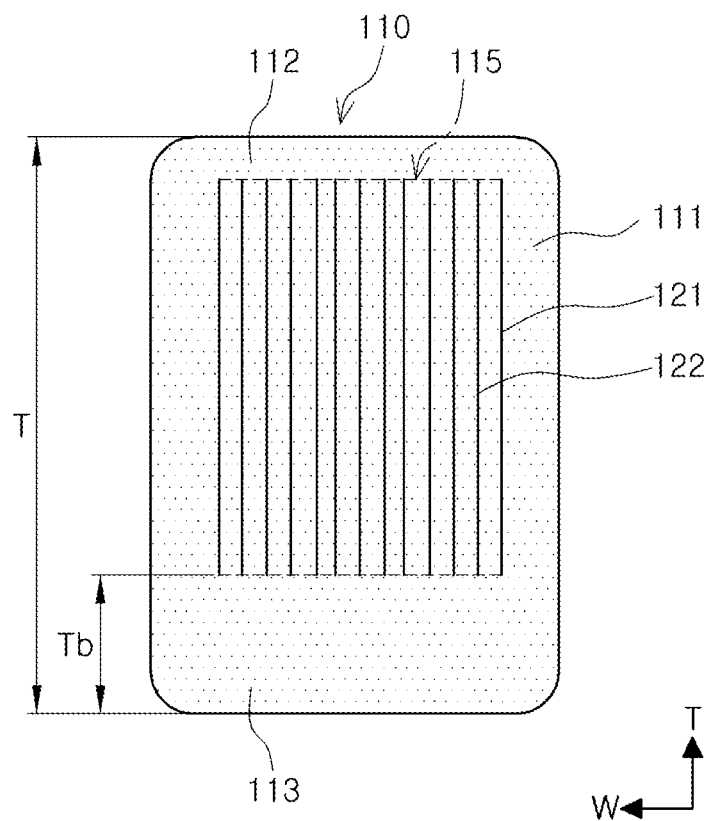
FIG. 4 is a cross-sectional view of the multilayer ceramic capacitor of FIG. 3 taken in a width direction.

FIG. 4 is a cross-sectional view of the multilayer ceramic capacitor of FIG. 3 taken in a width direction.

Referring to FIGS. 3 and 4, in a multilayer ceramic capacitor 100 according to another embodiment of the invention, a 'length direction' refers to an 'L' direction, a 'width direction' refers to a 'W' direction, and a 'thickness direction' refers to a 'T' direction. Here, the 'width direction' is the same as a direction in which dielectric layers 111 are stacked, that is, a 'stacking direction of first and second internal electrodes 121 and 122.'

That is, as shown in FIGS. 3 and 4, in the multilayer ceramic capacitor 100 according to the present embodiment of the invention, the stacking direction of the first and second internal electrodes 121 and 122 is the width direction of the ceramic body 110, unlike the multilayer ceramic capacitor according to the above-described embodiment of the invention.

When the multilayer ceramic capacitor 100 according to this embodiment of the invention is mounted on a board, the internal electrodes may be disposed to be perpendicular to the board.

Other features of the multilayer ceramic capacitor according to the present embodiment are the same as those of the multilayer ceramic capacitor according to the above-described embodiment, and descriptions thereof will not be unnecessarily repeated.

Hereafter, the invention will be described in detail with reference to Inventive and Comparative Examples, but is not limited thereto.

These Examples were carried out with respect to multilayer ceramic capacitors including dielectric layers having an average thickness of 0.6 μm or less, in order to test acoustic noise and capacitance implementation rate in accordance with a ratio Tb/T of a thickness Tb of a lower cover layer to a thickness T of a ceramic body.

The multilayer ceramic capacitors according to the Inventive Examples were manufactured as follows.

First, slurry containing a powder such as a barium titanate ($BaTiO_3$) powder having an average particle size of 0.1 μm was applied to a carrier film and dried, such that a plurality of ceramic green sheets having thicknesses of 1.05 μm and 0.95 μm, respectively, were prepared to form the dielectric layers 11.

Then, a conductive paste for internal electrodes containing 40 to 50 parts by weight of a nickel powder having an average particle size of 0.1 μm to 0.2 μm was prepared.

The conductive paste for internal electrodes was applied to the green sheets using a screen printing method to thereby form the internal electrodes, and 500 or more sheets were then stacked to form a multilayer body. Here, the ceramic green sheets having no internal electrodes were stacked below the ceramic green sheets having the internal electrodes in a greater amount than those being stacked above the ceramic green sheets having the internal electrodes.

The multilayer body was isostatically pressed at 85° C. under 1,000 kgf/cm².

Then, the multilayer body was cut into individual chips, and a de-binding process was performed on the cut chips while maintaining a temperature of 230° C. under an air atmosphere for 60 hours.

Then, the resultant chip was sintered at 1200° C. in a reduction atmosphere under an oxygen partial pressure of $10^{-11}$ atm to $10^{-10}$ atm, lower than an equilibrium oxygen partial pressure of Ni/NiO, so that the first and second internal electrodes 121 and 122 were not oxidized.

Next, processes such as an external electrode formation process, a plating layer formation process, and the like, were performed to manufacture the multilayer ceramic capacitor.

The multilayer ceramic capacitors according to the Comparative Examples were manufactured in the same manner as the method of the Inventive Examples, except that the ratio Tb/T of the thickness Tb of the lower cover layer to the thickness T of the ceramic body was different from the numerical range defined in the Inventive Examples.

The following Table 1 shows comparison results in terms of acoustic noise and capacitance implementation rates according to the ratio Tb/T of the thickness Tb of the lower cover layer to the thickness T of the ceramic body.

The acoustic noise is represented by measured values, and it may be appreciated that as the measured value is reduced, an effect of reducing acoustic noise is excellent.

With regard to the capacitance implementation rate (that is, a ratio of an actual capacitance percentage to a target value), when a target capacitance value is set to be 100%, a capacitance percentage of 80% or less was represented by "NG," and a capacitance percentage of 80% or more was represented by "OK."

TABLE 1

| Sample No. | Tb/T | AN (dB) | Capacitance Implementation Rate |
|---|---|---|---|
| *1  | 0.01 | 32.5 | OK |
| *2  | 0.02 | 31.2 | OK |
| 3   | 0.03 | 19.9 | OK |
| 4   | 0.05 | 18.7 | OK |
| 5   | 0.08 | 17.9 | OK |
| 6   | 0.14 | 17.3 | OK |
| 7   | 0.18 | 17.2 | OK |
| 8   | 0.20 | 17.4 | OK |
| 9   | 0.25 | 16.9 | OK |
| *10 | 0.26 | 16.7 | NG |
| *11 | 0.28 | 16.5 | NG |
| *12 | 0.29 | 16.4 | NG |

*Comparative Example, AN: Acoustic Noise

With reference to Table 1, it may be appreciated that in samples 1 and 2 (comparative examples) in which the ratio Tb/T of the thickness Tb of the lower cover layer to the thickness T of the ceramic body was less than 0.03, the acoustic noise was not reduced.

In addition, it may be appreciated that in samples 10 to 12 (comparative examples) in which the ratio Tb/T of the thickness Tb of the lower cover layer to the thickness T of the ceramic body was greater than 0.25, the capacitance implementation rate was decreased, so that a high capacitance multilayer ceramic capacitor could not be realized.

Meanwhile, it may be appreciated that in samples 3 to 9 (inventive examples) satisfying the numerical ranges of the present invention, the acoustic noise was significantly reduced, and a high capacitance multilayer ceramic capacitor having excellent reliability could be realized.

Board for Mounting Multilayer Ceramic Capacitor

Figure 5:
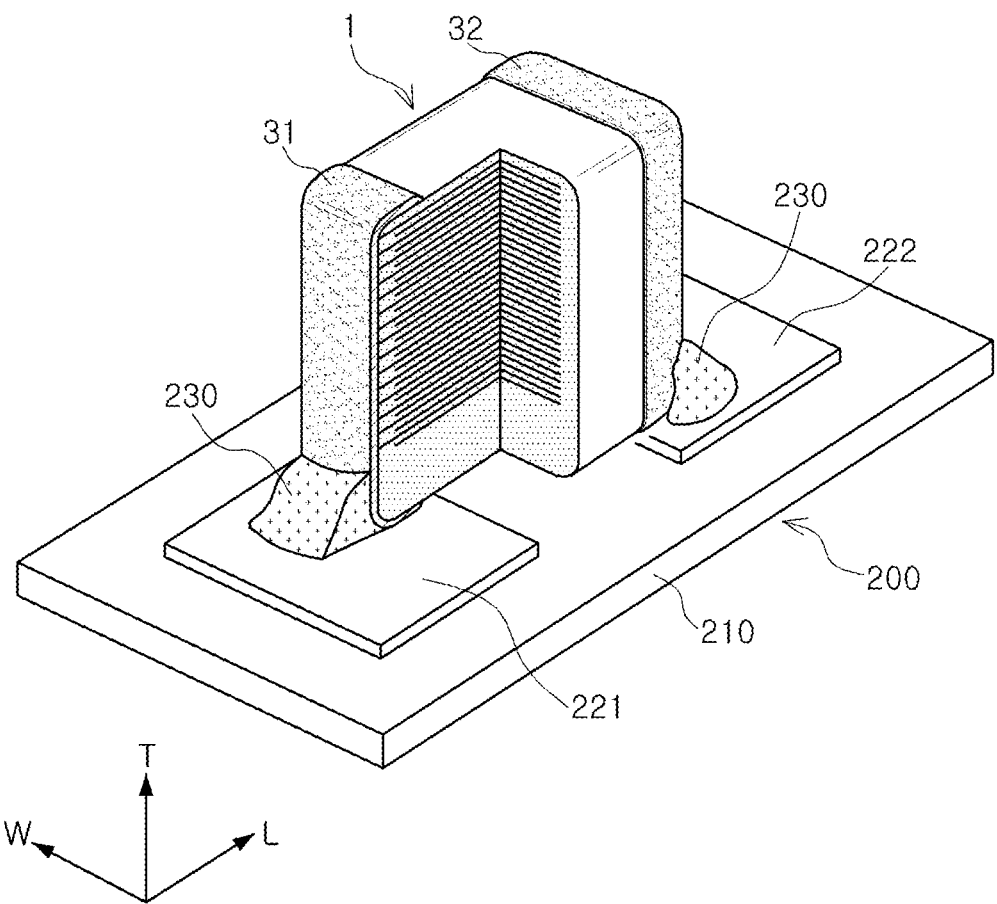
FIG. 5 is a perspective view of the multilayer ceramic capacitor of FIG. 1 mounted on a printed circuit board.

FIG. 5 is a perspective view of the multilayer ceramic capacitor of FIG. 1 mounted on a printed circuit board.

Figure 6:
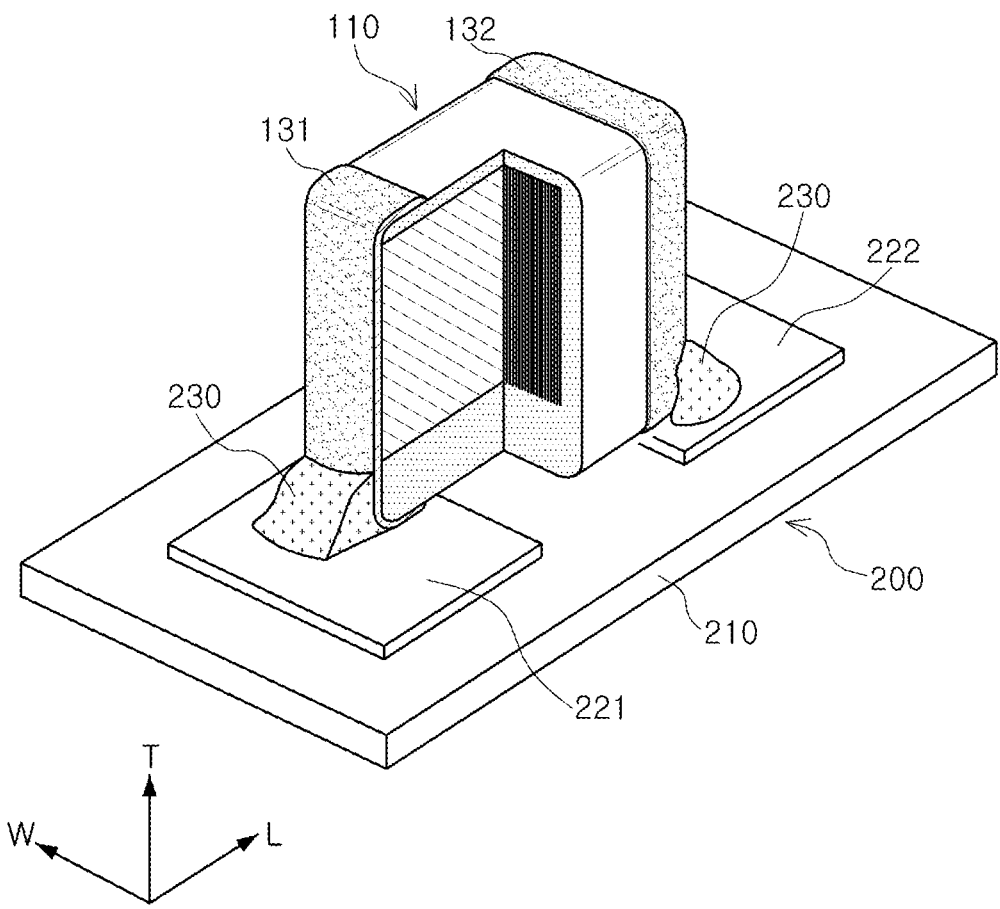
FIG. 6 is a perspective view of the multilayer ceramic capacitor of FIG. 3 mounted on a printed circuit board.

FIG. 6 is a perspective view of the multilayer ceramic capacitor of FIG. 3 mounted on a printed circuit board.

Referring to FIG. 5, a board 200 for mounting the multilayer ceramic capacitor 1 according to an embodiment of the invention may include a printed circuit board 210 on which the multilayer ceramic capacitor 1 is mounted horizontally, and first and second electrode pads 221 and 222 formed on the printed circuit board 210 so as to be spaced apart from each other.

Here, the multilayer ceramic capacitor 1 may be electrically connected to the printed circuit board 210 by a solder 230 in a state in which the first and second external electrodes 31 and 32 are positioned to contact the first and second electrode pads 221 and 222, respectively.

In addition, referring to FIG. 6, a board 200 for mounting the multilayer ceramic capacitor 100 according to another embodiment of the present invention may include a printed circuit board 210 on which the multilayer ceramic capacitor 1 is mounted vertically, and first and second electrode pads 221 and 222 formed on the printed circuit board 210 so as to be spaced apart from each other.

The board for mounting a multilayer ceramic electronic component according to the embodiment of the present invention may have a multilayer ceramic electronic component mounted thereon, the multilayer ceramic electronic component including a hexahedral ceramic body including dielectric layers and satisfying T/W>1.0 when a width thereof is defined as W, and a thickness thereof is defined as T, and having high capacitance implemented therein.

In addition, in the board for mounting a multilayer ceramic electronic component according to the embodiment of the invention, even in the case that the multilayer ceramic capacitor is mounted on the board horizontally or vertically, a ratio Tb/T of a thickness Tb of a lower cover layer to a thickness T of the ceramic body satisfies $0.03 \leq Tb/T \leq 0.25$, such that acoustic noise in the multilayer ceramic electronic component may be reduced.

Therefore, the board including the multilayer ceramic capacitor having high capacitance and excellent reliability may be obtained.

As set forth above, according to embodiments of the invention, a large capacitance multilayer ceramic electronic component having excellent reliability may be provided.

In addition, vibrations generated in the multilayer ceramic electronic component may be decreased to reduce acoustic noise when the multilayer ceramic electronic component is mounted on a printed circuit board. In addition, the assembly of the board and the multilayer ceramic electronic component may be improved, and a defect rate of the board may be reduced.

More specifically, according to the embodiments of the invention, a thickness of a ceramic body and a thickness of a lower cover layer inside the ceramic body may be controlled to reduce the acoustic noise when the multilayer ceramic electronic component is mounted on the printed circuit board.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
a hexahedral ceramic body including dielectric layers and satisfying T/W>1.0 when a width thereof is defined as W and a thickness thereof is defined as T;
an active layer in which capacitance is formed, by including a plurality of first and second internal electrodes alternately exposed through both end surfaces of the ceramic body, having the dielectric layer interposed therebetween,
an upper cover layer formed above the active layer;
a lower cover layer formed below the active layer and having a greater thickness than the upper cover layer; and
first and second external electrodes covering the end surfaces of the ceramic body,
wherein when a thickness of the lower cover layer is defined as Tb, $0.18 \leq Tb/T \leq 0.25$ is satisfied, and
the dielectric layers are stacked in an amount of 500 or more layers.

2. The multilayer ceramic electronic component of claim 1, wherein the dielectric layers have an average thickness of 0.1 μm to 0.6 μm.

3. The multilayer ceramic electronic component of claim 1, wherein the first and second internal electrodes have a thickness of 0.6 μm or less.

4. The multilayer ceramic electronic component of claim 1, wherein the first and second internal electrodes are stacked in a thickness direction of the ceramic body.

5. The multilayer ceramic electronic component of claim 1, wherein the first and second internal electrodes are stacked in a width direction of the ceramic body.

6. A board for mounting a multilayer ceramic electronic component, the board comprising:
  a printed circuit board having first and second electrode pads disposed thereon; and
  a multilayer ceramic electronic component mounted on the printed circuit board,
  wherein the multilayer ceramic electronic component includes:
  a hexahedral ceramic body including dielectric layers and satisfying T/W>1.0 when a width thereof is defined as W, and a thickness thereof is defined as T;
  an active layer in which capacitance is formed, by including a plurality of first and second internal electrodes alternately exposed through both end surfaces of the ceramic body, having the dielectric layer interposed therebetween;
  an upper cover layer formed above the active layer;
  a lower cover layer formed below the active layer and having a greater thickness than the upper cover layer; and
  first and second external electrodes covering the end surfaces of the ceramic body,
  when a thickness of the lower cover layer is defined as Tb, $0.18 \leq Tb/T \leq 0.25$ is satisfied, and
  the dielectric layers are stacked in an amount of 500 or more layers.

7. The board of claim 6, wherein the dielectric layers have an average thickness of 0.1 μm to 0.6 μm.

8. The board of claim 6, wherein the first and second internal electrodes have a thickness of 0.6 μm or less.

9. The board of claim 6, wherein the first and second internal electrodes are stacked in a thickness direction of the ceramic body.

10. The board of claim 6, wherein the first and second internal electrodes are stacked in a width direction of the ceramic body.

* * * * *